United States Patent
Malhotra et al.

(10) Patent No.: US 8,563,392 B2
(45) Date of Patent: Oct. 22, 2013

(54) METHOD OF FORMING AN ALD MATERIAL

(75) Inventors: Sandra Malhotra, San Jose, CA (US);
Wim Deweerd, San Jose, CA (US);
Edward Haywood, San Jose, CA (US);
Hiroyuki Ode, Higashihiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 103 days.

(21) Appl. No.: 13/310,980

(22) Filed: Dec. 5, 2011

(65) Prior Publication Data

US 2013/0143383 A1     Jun. 6, 2013

(51) Int. Cl.
*H01L 21/02* (2006.01)

(52) U.S. Cl.
USPC ............................ 438/396; 257/E21.011

(58) Field of Classification Search
USPC ................... 438/396; 257/E27.048, E21.011
See application file for complete search history.

(56) References Cited

U.S. PATENT DOCUMENTS

| | | | |
|---|---|---|---|
| 2006/0154436 A1* | 7/2006 | Kim et al. | 438/396 |
| 2009/0163647 A1* | 6/2009 | DeLuca et al. | 524/588 |
| 2011/0045183 A1 | 2/2011 | Cho et al. | |

* cited by examiner

*Primary Examiner* — William D Coleman

(57) ABSTRACT

In some embodiments of the present invention, methods are developed wherein a gas flow of an electron donating compound (EDC) is introduced in sequence with a precursor pulse and alters the deposition of the precursor material. In some embodiments, the EDC pulse is introduced sequentially with the precursor pulse with a purge step used to remove the non-adsorbed EDC from the process chamber before the precursor is introduced. In some embodiments, the EDC pulse is introduced using a vapor draw technique or a bubbler technique. In some embodiments, the EDC pulse is introduced in the same gas distribution manifold as the precursor pulse. In some embodiments, the EDC pulse is introduced in a separate gas distribution manifold from the precursor pulse.

15 Claims, 4 Drawing Sheets

METHOD OF FORMING AN ALD MATERIAL

This document relates to the subject matter of a joint research agreement between Intermolecular, Inc. and Elpida Memory, Inc.

FIELD OF THE INVENTION

The present invention relates generally to the formation electrodes used in capacitors used in Dynamic Random Access Memory (DRAM) devices

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally <$10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, $ZrO_2$, etc. Titanium dioxide ($TiO_2$) is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of $TiO_2$, the anatase crystalline phase of $TiO_2$ has a dielectric constant of approximately 40, while the rutile crystalline phase of $TiO_2$ can have a dielectric constant of approximately >80. Due to the higher-k value of the rutile-phase, it is desirable to produce $TiO_2$ based DRAM capacitors with the $TiO_2$ in the rutile-phase. The relative amounts of the anatase phase and the rutile phase can be determined from x-ray diffraction (XRD). From Eqn. 1 above, a $TiO_2$ layer in the rutile-phase could be physically thicker and maintain the desired capacitance. The increased physical thickness is important for lowering the leakage current of the capacitor. The anatase phase will transition to the rutile phase at high temperatures (>800 C). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history)

which helps to minimize the leakage current of the DRAM device. However, oxygen-rich phases ($MoO_{2+x}$) degrade the performance of the $MoO_2$ electrode because they do not promote the deposition of the rutile-phase of $TiO_2$ and have higher resistivity than $MoO_2$. For example, $MoO_3$ (the most oxygen-rich phase) has an orthorhombic crystal structure and is a dielectric.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in a reducing atmosphere have been developed that allow crystalline $MoO_2$ to be used as the first electrode (i.e. bottom electrode) in MIM DRAM capacitors with $TiO_2$ or doped-$TiO_2$ high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference.

One consequence of the developing interest in the use of non-noble materials as electrode materials for DRAM capacitors is that new manufacturable precursors and processes must be developed for their implementation in atomic layer deposition (ALD) or chemical vapor deposition (CVD) processes. The precursors and processes must produce high quality films with good control over the concentration, thickness, and uniformity. Further, the precursors and processes must not introduce unwanted contaminants into the film. Therefore, there is a need to develop precursors and processes that meet these requirements.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, methods are developed wherein a gas flow of an electron donating compound (EDC) is introduced in sequence with a precursor pulse and alters the deposition of the precursor material. In some embodiments, the EDC pulse is introduced sequentially with the precursor pulse with a purge step used to remove the non-adsorbed EDC from the process chamber before the precursor is introduced. In some embodiments, the EDC pulse is introduced using a vapor draw technique or a bubbler technique. In some embodiments, the EDC pulse is introduced in the same gas distribution manifold as the precursor pulse. In some embodiments, the EDC pulse is introduced in a separate gas distribution manifold from the precursor pulse.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
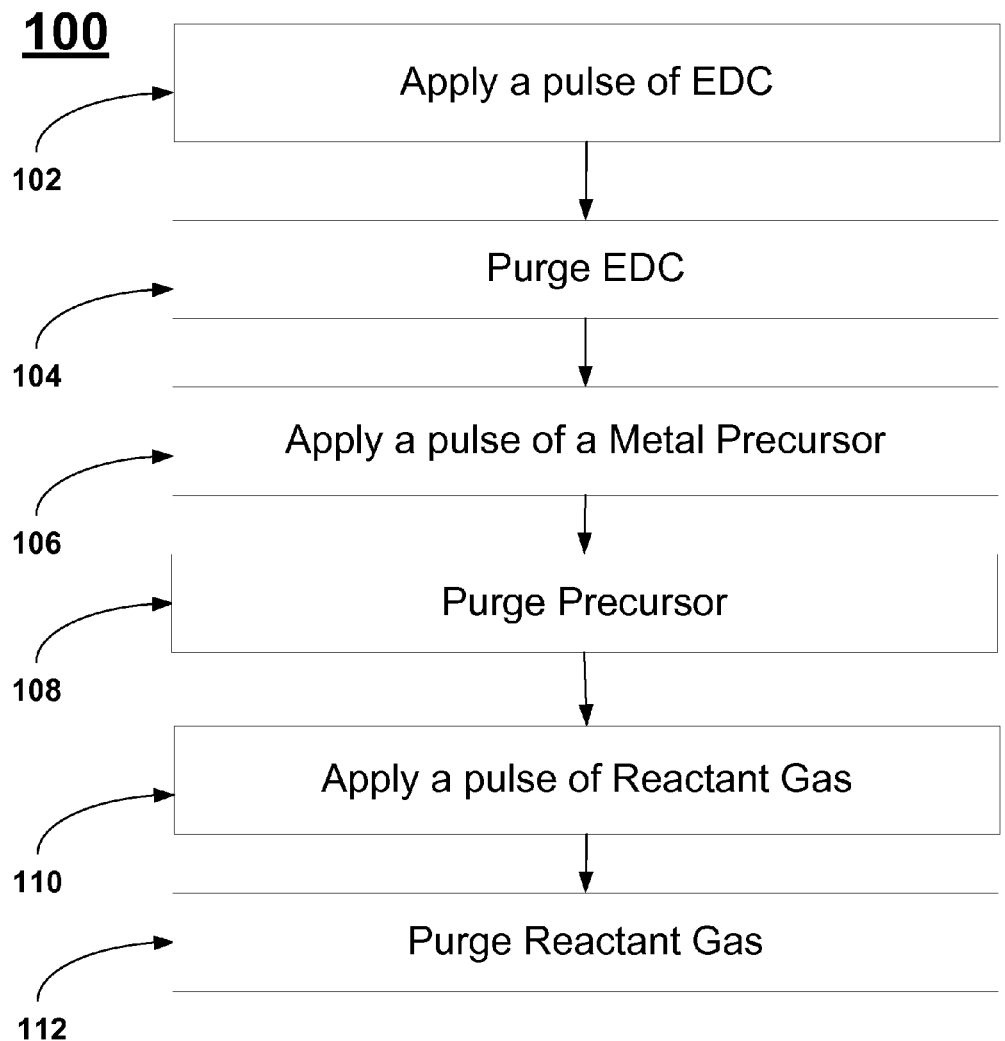
FIG. 1 illustrates a flow chart of a method according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Transition metal compounds such as metal oxides, metal nitrides, metal carbides, and metal silicides have many applications in the manufacture of semiconductor devices, and specifically DRAM capacitor stacks. As an example, conductive metal oxides and conductive metal nitrides of the transition metals can be used as electrode materials in the capacitor stack. It is desirable to form these materials using techniques such as atomic layer deposition (ALD) or chemical vapor deposition (CVD). This requires the development of metal containing precursors that are volatile and stable at elevated temperatures. Typically, the chemical precursors for transition metals are either liquids with a low vapor pressure or are solids at room temperature. Therefore, the source ampoules must be heated to volatilize the precursor for delivery to the process chamber. Typically, the precursors are delivered to the process chamber as part of a carrier gas stream wherein the carrier gas is bubbled through the ampoule (in the case of liquid precursors) or simply flowed through the ampoule (in the case of solid precursors).

Chemical precursors of the transition metals may a wide range of thermal stability, generally exhibiting thermal decomposition in the temperature range between about 200 C and about 400 C. However, there is generally a tradeoff between thermal stability and film deposition rate. Transition metal precursors with high thermal stability (i.e. greater then about 300 C) generally have lower deposition rates because of the robustness of the chemical bonding. This is undesirable for high volume manufacturing. Conversely, transition metal precursors with low thermal stability (i.e. less than about 300 C) generally have higher deposition rates because of the weakness of the chemical bonding. This is desirable for high volume manufacturing, but presents challenges for control of the deposition process. Typical ALD processes for the formation of electrode materials or dielectric materials for use in DRAM capacitors are generally performed in a temperature range between about 230 C and about 270 C. During the ALD process, a pulse of the precursor is introduced into the process chamber wherein a portion of the precursor adsorbs onto the substrate surface. During this pulse, if the precursor decomposes too easily, it may be difficult to control the composition and uniformity of the deposited film.

The stability of the chemical precursors of the transition metals may be improved by providing an electron donating compound (EDC) to prevent or retard the thermal decomposition of the precursor. The EDC helps to stabilize the precursor by donating electrons to the metal ion of the precursor. This establishes a weak bond between the precursor and the EDC. The additional bonding helps to stabilize the precursor, but is not so strong as to interfere with the reactivity and formation of the metal compound during subsequent reactions with the reactant gas. Examples of EDC materials comprise ethyl methyl amine (EMA), octane-based amines.

FIG. 1 illustrates a flow chart, 100, of a method according to some embodiments. In step 102, a pulse of an EDC is applied to the surface of a substrate being held in a process chamber. The EDC may be applied using typical vapor draw or bubbler techniques that are well known in the art. Typically, the substrate is heated to a temperature between about 230 C and about 270 C. A portion of the EDC will adsorb onto the substrate surface. In step 104, the non-adsorbed EDC is purged from the process chamber using an inert gas. Examples of inert gases comprise $N_2$, Ar, etc. In step 106, a pulse of a metal precursor is applied to the surface of the substrate. A portion of the metal precursor will adsorb/react with the EDC to form an EDC stabilized metal-containing layer on the substrate surface. In some embodiments, the metal precursor and the EDC are introduced into the process chamber through different gas distribution manifolds built into the showerhead of the process chamber. In some embodiments, the metal precursor and the EDC are introduced into the process chamber through the same gas distribution manifolds built into the showerhead of the process chamber. The gas distribution will depend on the detailed design of the process chamber and showerhead and is not meant to limiting in the present invention. In step 108, the non-adsorbed/non-reacted metal precursor is purged from the process chamber using an inert gas. In step 110, a pulse of a reactant gas is applied to the surface of the substrate. A portion of the reactant gas will react with the EDC stabilized metal-containing layer on the substrate surface to form the metal compound. In step 112, the reactant gas is purged from the process chamber using an inert gas. Steps 102-112 can be repeated as required until the metal compound is formed having the desired thickness.

It was observed that step 104 is an important step to fully realize the full benefits of the present invention. Typically, materials that are useful as EDC materials have high vapor pressures. Therefore, the concentration of the EDC in the process chamber may overwhelm the metal precursor. The high concentration of EDC within the process chamber may interfere with the formation of the metal compound on the substrate surface.

There are other sequences that might be implemented to use an EDC to stabilize a metal precursor. As an example, one sequence could pulse the EDC at the same time as the metal precursor. In a second example, a constant flow of the EDC could be established and the metal precursor could be pulsed during a time in the middle of the EDC flow. However, these sequences were found to degrade the performance of capacitor stacks formed in this manner. Specifically, the capacitor stacks made using these sequences exhibited high leakage current.

Figure 2:
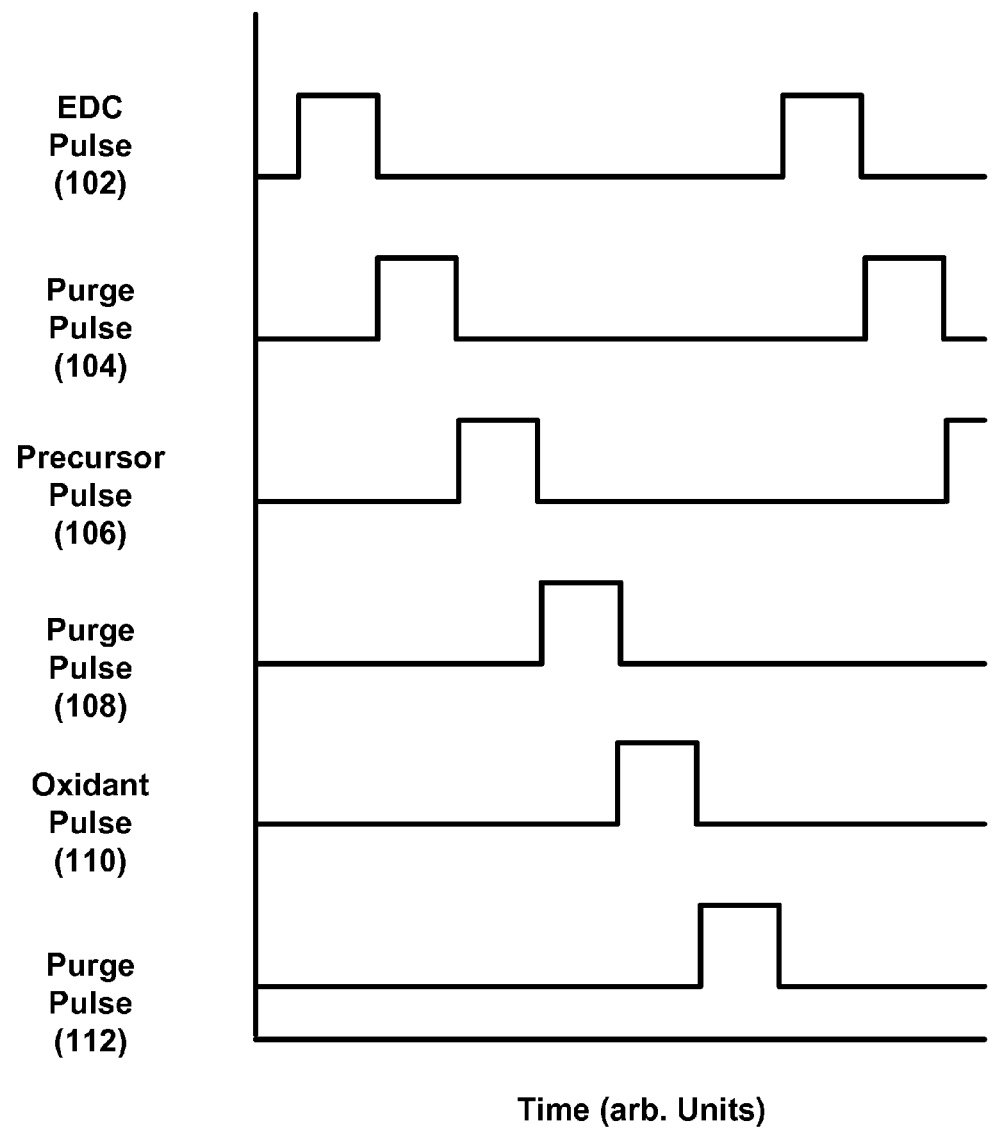
FIG. 2 illustrates a pulse timing chart of a method according to some embodiments.

FIG. 2 illustrates a pulse timing chart of a method according to some embodiments. The timing chart is merely an illustration of the method outlined in the flow chart presented in FIG. 1. The numbering of the steps is consistent with the steps in FIG. 1 for clarity. In step 102, a pulse of an EDC is applied to the surface of a substrate being held in a process chamber. A portion of the EDC will adsorb onto the substrate surface. In step 104, the non-adsorbed EDC is purged from the process chamber using an inert gas. The timing chart in FIG. 2 illustrates that the pulse of the purge gas starts after the termination of the pulse of the EDC. Examples of inert gases comprise $N_2$, Ar, etc. In step 106, a pulse of a metal precursor is applied to the surface of the substrate. The timing chart in FIG. 2 illustrates that the pulse of the metal precursor gas starts after the termination of the pulse of the purge gas. A portion of the metal precursor will adsorb/react with the EDC to form an EDC stabilized metal-containing layer on the substrate surface. In step 108, the non-adsorbed/non-reacted metal precursor is purged from the process chamber using an inert gas. The timing chart in FIG. 2 illustrates that the pulse of the purge gas starts after the termination of the pulse of the metal precursor gas. In step 110, a pulse of a reactant gas is applied to the surface of the substrate. The timing chart in FIG. 2 illustrates that the pulse of the oxidant gas starts after the termination of the pulse of the purge gas. A portion of the oxidant gas will react with the adsorbed EDC stabilized metal-containing layer on the substrate surface to form a metal oxide. In step 112, the oxidant gas is purged from the process chamber using an inert gas. The timing chart in FIG. 2 illustrates that the pulse of the purge gas starts after the termination of the pulse of the oxidant gas. Steps 102-112 can be repeated as required until the metal oxide is formed having the desired thickness. In FIG. 2, an oxidant gas is used as an illustration of the reactant gas to form a metal oxide material. As discussed previously, metal oxide compounds may be used as either an electrode material or a dielectric material within a capacitor stack, depending on their electrical properties. Those skilled in the art will understand that the method and steps illustrated in FIGS. 1 and 2 are not limited to metal oxide materials and may be equally applied to other metal compounds such as metal nitrides, metal carbides, and metal silicides. The use of the metal oxide compound is in no way limiting the scope of the present invention.

Figure 3:
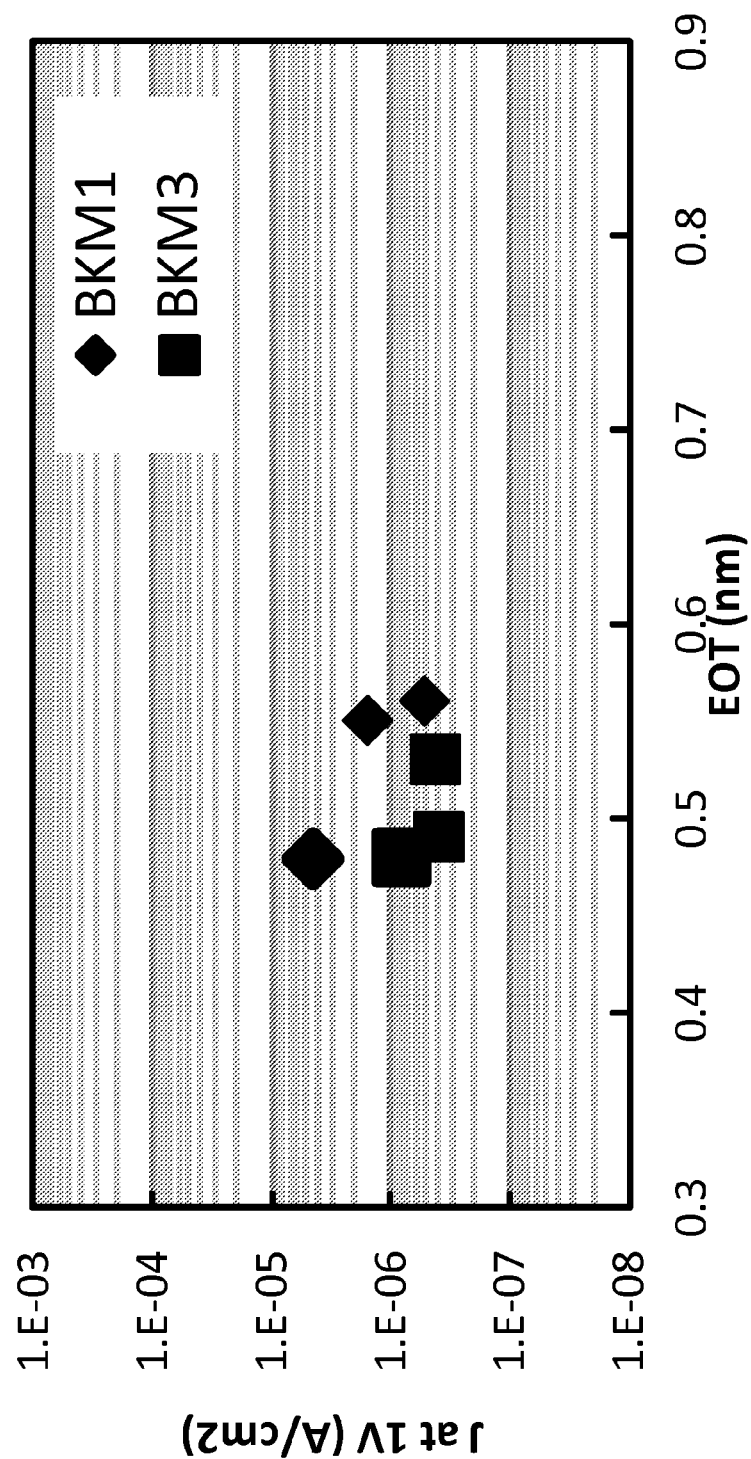
FIG. 3 presents data for leakage current versus EOT for the standard process (BKM1) and a method of some embodiments of the present invention (BKM3).

FIG. 3 presents data for leakage current versus EOT for the standard process (BKM1) and a method of some embodiments of the present invention (BKM3). Two sets of simple capacitor stacks were manufactured to demonstrate the benefits of some embodiments of the present invention.

A first set of samples (herein labeled BKM1) comprised a first electrode material of molybdenum oxide deposited using ALD at a temperature of about 200 C. An ozone concentration of 6 weight % was used as the reactant gas. The deposition of the molybdenum oxide did not use an EDC. A high k dielectric stack comprising about 7.9 nm of TiO2 doped with Al doped $TiO_2$. The Al doping level was about 10 atomic %. The high k dielectric stack further comprised about 1.2 nm $ZrO_2$ formed over the Al-doped $TiO_2$ material. A second electrode material comprising Pt was used to complete the capacitor stack. The capacitor stack was annealed at 460 C for 10 minutes in a dilute oxygen atmosphere. The capacitor stack was tested to determine the EOT, leakage current, capacitance, etc. The leakage current at 1V at room temperature for a range of EOT values is presented in FIG. 3.

A second set of samples (herein labeled BKM3) comprised a first electrode material of molybdenum oxide deposited using ALD at a temperature of about 200 C. An ozone concentration of 6 weight % was used as the reactant gas. The deposition of the molybdenum oxide used an EDC as illustrated in FIGS. 1 and 2. In the preparation of these samples, the EDC was EMA. A high k dielectric stack comprising about 7.9 nm of TiO2 doped with Al doped TiO$_2$. The Al doping level was about 10 atomic %. The high k dielectric stack further comprised about 1.2 nm ZrO$_2$ formed over the Al-doped TiO$_2$ material. A second electrode material comprising Pt was used to complete the capacitor stack. The capacitor stack was annealed at 460 C for 10 minutes in a dilute oxygen atmosphere. The capacitor stack was tested to determine the EOT, leakage current, capacitance, etc. The leakage current at 1V at room temperature for a range of EOT values is presented in FIG. 3.

The data in FIG. 3 indicate that the samples formed using the method as illustrated in FIGS. 1 and 3 (i.e. BKM3) exhibited lower leakage current than those formed using the standard method (i.e. BKM1). The reduction in leakage current can be attributed to the new method as described since the samples were otherwise equivalent in composition, structure, and processing history.

The previous discussion has used examples of conductive metal oxides operable as electrode materials in the capacitor stack. Those skilled in the art will understand that the methods and embodiments of the present invention may be applied to the dielectric materials within the capacitor stack. Examples of suitable dielectric materials comprise Al$_2$O$_3$, BaSrTiO$_x$ (BST), HfO$_2$, HfSiO$_x$, Nb$_2$O$_5$, PbZrTiO$_x$ (PZT), SiO$_2$, a bilayer of SiO$_2$ and Si$_x$N$_y$, SiON, SrTiO$_3$ (STO), Ta$_2$O$_5$, TiO$_2$, ZrO$_2$, or doped versions of the same. These dielectric materials may be formed as a single layer or may be formed as a hybrid or nanolaminate structure. A specific dielectric material of interest is TiO$_2$ doped with one or more of Al, Ce, Co, Er, Ga, Gd, Ge, Hf, In, La, Lu, Mg, Mn, Nd, Pr, Sc, Si, Sn, Sr, Y, Zr, or combinations thereof. A specific dielectric material of interest is TiO$_2$ doped with Al$_2$O$_3$ to between about 5 atomic % and about 15 atomic % Al (Al/(Al+Ti) atomic %). Additionally, other conductive materials may be used as electrode materials in the capacitor stack. Examples of suitable conductive materials for the electrode materials comprise Co, CoN, Ir, MoN, MoO$_2$, Ni, NiN, NiO, Pt, Pd, Ru, RuO$_2$, TiN, VN, WN, or combinations thereof. These materials may be deposited using ALD techniques and may also benefit from the methods described in some embodiments of the present invention.

Figure 4:
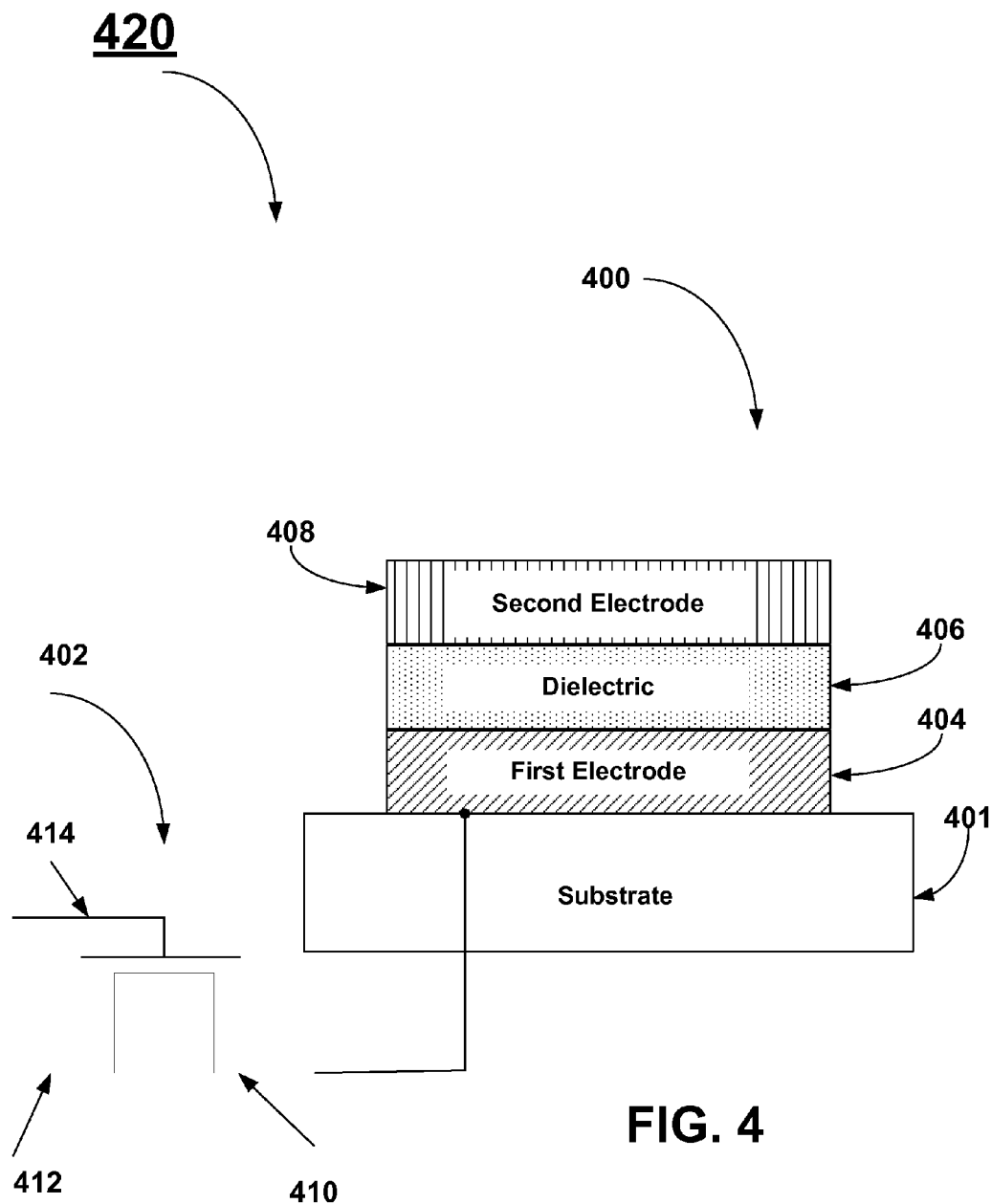
FIG. 4 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 4 is used to illustrate one DRAM cell, 420, manufactured using a method as discussed previously in reference to FIGS. 2 and 3. The cell, 420, is illustrated schematically to include two principle components, a cell capacitor, 400, and a cell transistor, 402. The cell transistor is usually constituted by a MOS transistor having a gate, 414, source, 410, and drain, 412. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 400, comprises a first electrode layer, 404, formed above substrate, 401. The first electrode layer, 404, is connected to the source or drain of the cell transistor, 402. For illustrative purposes, the first electrode has been connected to the source, 410, in this example. First electrode layer, 404, may be subjected to an anneal in a reducing atmosphere before the formation of the dielectric layer if the first electrode layer is a conductive metal oxide such as MoO$_2$. A doped high k dielectric layer, 406, is formed above the first electrode layer. Examples of suitable dielectric materials comprise Al$_2$O$_3$, BaSrTiO$_x$ (BST), HfO$_2$, HfSiO$_x$, Nb$_2$O$_5$, PbZrTiO$_x$ (PZT), SiO$_2$, a bilayer of SiO$_2$ and Si$_x$N$_y$, SiON, SrTiO$_3$ (STO), Ta$_2$O$_5$, TiO$_2$, ZrO$_2$, or doped versions of the same. These dielectric materials may be formed as a single layer or may be formed as a hybrid or nanolaminate structure. If the doped high k dielectric layer is TiO$_2$, then the dielectric layer will be lightly or non-doped so that the rutile phase of TiO$_2$ can be formed above the first electrode. Typical dopants for TiO$_2$ comprise Al, Ce, Co, Er, Ga, Gd, Ge, Hf, In, La, Lu, Mg, Mn, Nd, Pr, Sc, Si, Sn, Sr, Y, Zr, or combinations thereof. Typically, the first electrode layer and the high k dielectric layer are then subjected to a PDA treatment. Second electrode layer, 408, is formed above the dielectric layer. Examples of suitable conductive materials for the electrode materials comprise Co, CoN, Ir, MoN, MoO$_2$, Ni, NiN, NiO, Pt, Pd, Ru, RuO$_2$, TiN, VN, WN, or combinations thereof. Advantageously, the second electrode layer is a conductive metal oxide. Examples of such a conductive metal oxide second electrode layer include the conductive compounds of chromium oxide, cobalt oxide, iridium oxide, manganese oxide, molybdenum oxide, tungsten oxide, rhodium oxide, ruthenium oxide, or tin oxide. This completes the formation of the capacitor stack. Typically, the capacitor stack is then subjected to a PMA treatment. Advantageously, one or more of the first electrode layer, 404, the dielectric layer, 406, or the second electrode layer, 408, may be formed using an EDC according to the methods described previously.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack comprising:
  forming a first material above a substrate, wherein the first material is operable as a first electrode of the capacitor stack, wherein the first material is one of a conductive metal oxide, conductive metal silicide, conductive metal carbide, conductive metal nitride, or combinations thereof;
  forming a second material above the first material, wherein the second material is operable as a dielectric of the capacitor stack; and
  forming a third material above the second material, wherein the third material is operable as a second electrode of the capacitor stack, and wherein the forming of the first material, comprises:
    a) providing the substrate to a reaction chamber;
    b) pulsing an electron donating compound into the reaction chamber to form an adsorbed electron donating compound on the substrate;

c) purging the reaction chamber to remove non-adsorbed electron donating compound;

d) pulsing a metal-containing precursor into the reaction chamber to react with the adsorbed electron donating compound on the substrate, forming an electron donating compound stabilized metal-containing layer on the substrate;

e) purging the reaction chamber to remove non-adsorbed metal-containing precursor;

f) pulsing an reactant gas into the reaction chamber to react with the electron donating compound stabilized metal-containing layer, forming a metal compound layer on the substrate;

g) purging the reaction chamber to remove unreacted reactant gas;

h) repeating steps b) through g) until a desired thickness of the metal compound layer is reached.

2. The method of claim 1 wherein the reactant gas is an oxidizing gas and the first material is a conductive metal oxide comprising one of molybdenum oxide, tungsten oxide, ruthenium oxide, iron oxide, iridium oxide, chromium oxide, manganese oxide, tin oxide, cobalt oxide, or nickel oxide.

3. The method of claim 1 wherein the second material is one of $Al_2O_3$, $BaSrTiO_x$ (BST), $HfO_2$, $HfSiO_x$, $Nb_2O_5$, $PbZrTiO_x$ (PZT), $SiO_2$, $SrTiO_3$ (STO), $Ta_2O_5$, $TiO_2$, or $ZrO_2$ and is formed using the method of steps a) through h).

4. The method of claim 1 wherein the third material is one of a metal, metal alloy, conductive metal oxide, conductive metal silicide, conductive metal carbide, conductive metal nitride, or combinations thereof and is formed using the method of steps a) through h).

5. The method of claim 1 wherein the electron donating compound is ethyl methyl amine.

6. The method of claim 1 wherein the electron donating compound is an octane-based amine.

7. The method of claim 2 wherein the conductive metal oxide is molybdenum oxide.

8. The method of claim 7 wherein the substrate and the first material are annealed before the forming of the dielectric layer.

9. The method of claim 3 wherein the second material is $TiO_2$.

10. The method of claim 9 wherein the second material further comprises a dopant.

11. The method of claim 10 wherein the dopant comprises at least one of Al, Ce, Co, Er, Ga, Gd, Ge, Hf, In, La, Lu, Mg, Mn, Nd, Pr, Sc, Si, Sn, Sr, Y, or Zr.

12. The method of claim 11 wherein the substrate, the first material, and the second material are annealed before the forming of the third material.

13. The method of claim 4 wherein the reactant gas is an oxidizing gas and the third material is a conductive metal oxide comprising one of molybdenum oxide, tungsten oxide, ruthenium oxide, iron oxide, iridium oxide, chromium oxide, manganese oxide, tin oxide, cobalt oxide, or nickel oxide.

14. The method of claim 13 wherein the conductive metal oxide is molybdenum oxide.

15. The method of claim 14 wherein the substrate, the first material, the second material, and the third material are annealed after the forming of the third material.

* * * * *